United States Patent [19]
Boomer

[11] Patent Number: 5,256,914
[45] Date of Patent: Oct. 26, 1993

[54] SHORT CIRCUIT PROTECTION CIRCUIT AND METHOD FOR OUTPUT BUFFERS

[75] Inventor: James B. Boomer, Falmouth, Me.

[73] Assignee: National Semiconductor Corporation, Santa Clara, Calif.

[21] Appl. No.: 771,400

[22] Filed: Oct. 3, 1991

[51] Int. Cl.$^5$ .................. H03K 17/16; H03K 19/00
[52] U.S. Cl. .................. 307/443; 307/473; 307/296.4; 361/98
[58] Field of Search .......... 307/443, 296.4, 473; 361/88, 93, 98, 101

[56] References Cited

U.S. PATENT DOCUMENTS

| | | | |
|---|---|---|---|
| 4,178,620 | 12/1979 | Yu | 361/98 |
| 4,342,065 | 7/1982 | Larson | 307/473 |
| 4,581,550 | 4/1986 | Ferris et al. | 307/473 |
| 4,649,297 | 3/1987 | Vazehgoo | 307/456 |
| 4,661,727 | 4/1987 | Ferris et al. | 307/456 |
| 4,677,320 | 6/1987 | Hannington | 307/475 |
| 4,717,846 | 1/1988 | Ando | 307/443 |
| 4,791,522 | 12/1988 | Bergh | 361/98 |
| 4,884,165 | 11/1989 | Kong et al. | 361/98 |
| 4,896,244 | 1/1990 | Kalina | 361/101 |
| 4,961,010 | 10/1990 | Davis | 307/443 |
| 5,036,222 | 7/1991 | Davis | 307/443 |
| 5,049,763 | 9/1991 | Rogers | 307/443 |
| 5,051,623 | 9/1991 | Yarbrough et al. | 307/473 |

Primary Examiner—Edward P. Westin
Assistant Examiner—Andrew Sanders
Attorney, Agent, or Firm—Daniel H. Kane; James W. Rose; Richard C. Calderwood

[57] ABSTRACT

An output buffer circuit (10,11) is protected by a short circuit protection circuit (12) from short circuit conditions at the output by detecting occurrence of a short circuit condition of the output ($V_{OUT}$) shorted to either the high or low potential power rails ($V_{CC}$, GND) and by tristating the output buffer circuit upon detecting the short circuit condition. Detection of a short circuit condition is accomplished by sensing and comparing the respective states of signals at the input ($V_{IN}$) and output ($V_{OUT}$) and detecting occurrence of an out of state condition between the input and output. If the out of state condition is sensed for a sensing time delay period (tC1, tC2) longer than characteristic propagation delay times (tpHL, tpLH), a short circuit sensing signal (VLO, VHI) is generated. Tristating the output buffer circuit is accomplished by logically processing the short circuit sensing signal (VLO, VHI), generating a short circuit tristate enable signal (SOEB), and coupling the short circuit tristate enable signal (SOEB) to a tristate enable circuit input (14) of a tristate enable circuit (10, 11) for tristating the output buffer circuit. The sensing time delay period is achieved by charging an integrating capacitor (C1, C2) in a sensing signal circuit (21, 22). The sensing signal circuit is reset after detecting occurrence of a short circuit condition at the output. Resetting is delayed for a reset time delay period (tC3) substantially greater than the sensing time delay period (tC1, tC2). The reset time delay period is measured by discharging a reset delay capacitor (C3). The short circuit sensing sequence is then repeated.

25 Claims, 6 Drawing Sheets

SHORT CIRCUIT PROTECTION CIRCUIT AND METHOD FOR OUTPUT BUFFERS

TECHNICAL FIELD

This invention relates to a new short circuit protection circuit for output buffer circuits. The invention detects short circuit conditions of the output shorted to either a high or low potential power rail. For tristate output buffer circuits, the invention makes use of the existing tristate enable circuitry for tristating the output buffer circuit upon detecting the short circuit condition. For non-tristate output buffers, the invention adds tristate-type circuitry for purposes of short circuit protection. The invention is intended to prevent extended electrical overload from a prolonged short circuit condition and is particularly applicable for CMOS output buffer circuits.

BACKGROUND ART

The output buffer circuits of an integrated circuit device are characterized by relatively large current drive and power capacity for applying the results of internal logic circuitry to an external load. Such buffer circuits 10,11 may be indicated by the schematic representations of FIGS. 1 and 2 showing respectively non-inverting 10 and inverting 11 output buffer circuits. The non-inverting tristate output buffer circuit 10 delivers output signals with high H and low L potential states at the output $V_{OUT}$ in response to respective input signals of high H and low L potential states at the input $V_{IN}$. Conversely, the inverting tristate output buffer circuit 11 delivers inverted output signals of low L and high H potential states at the output $V_{OUT}$. The output buffer circuits have characteristic propagation delay times tpHL, tpLH for respective transitions from high to low HL and low to high LH potential states at the output $V_{OUT}$.

The tristate output buffer circuits 10,11 include tristate enable circuitry with a tristate enable input 14. The tristate enable circuit causes a high impedance third state Z at the output $V_{OUT}$ of the output buffer circuits 10,11 in response to a high potential level tristate enable signal OEB at the tristate enable input 14. Applying the high impedance third state Z at the output $V_{OUT}$ is referred to herein as "tristating" the output buffer circuit. The tristate condition is useful when the tristate output buffer circuit is coupled to a common bus. The tristate condition provides a "quiet" output when other output buffer circuits are active on the common bus. Bipolar TTL tristate output buffer circuits with tristate enable circuits are illustrated in U.S. Pat. Nos. 5,051,623; 4,649,297; 4,677,320; 4,661,727; & 4,581,550. CMOS tristate output buffer circuits with CMOS tristate enable circuits are shown in U.S. Pat. Nos. 5,036,222; 5,049,763 (FIG. 24); 4,961,010; and U.S. patent application Ser. No. 483,927 filed Feb. 22, 1990.

The output buffer circuits 10,11 are coupled between high and low potential power rails $V_{CC}$, GND for controlled sourcing and sinking of current at the output $V_{OUT}$. In the case of a prolonged short circuit condition of the output shorted to the high or low potential power rail, uncontrolled current flow may lead to extended electrical overload, heating, and damage to integrated circuit devices coupled to the output.

Short circuit current protection from large transient currents has been provided by coupling a resistor in series with the output to limit the amount of current in the event of a transient short circuit condition at the output. Alternatively active techniques have been used to shunt current away from the base of an output transistor to limit output current in the event of a large transient short circuit current.

For extended electrical overload resulting from a prolonged short circuit condition at the output, thermal sensing has been used. A large temperature gradient across an integrated circuit die or a high temperature is detected and the circuit is shut down before thermal damage occurs. A disadvantage of the thermal shutdown short circuit protection is the slow response time in the order of milliseconds.

OBJECTS OF THE INVENTION

It is therefore an object of the present invention to provide short circuit current protection for output buffer circuits from prolonged short circuit conditions of the output shorted to either the high or low potential power rails. The invention is intended to provide short circuit protection with fast response time after a specified sensing delay time period.

Another object of the invention is to provide a short circuit current protection circuit with periodic sensing of a short circuit condition and periodic resetting of the short circuit protection circuit for fast recovery of the output buffer circuit once the short circuit condition is removed.

Generally the invention seeks to prevent short circuit damage to an IC device caused by electrical overstress but with fast response and with fast return of the circuit to normal operation.

DISCLOSURE OF THE INVENTION

In order to accomplish this result the invention generally contemplates a method of protecting an output buffer circuit by detecting occurrence of a short circuit condition of the output shorted to either the high or low potential power rails, and tristating the output buffer circuit upon detecting the short circuit condition.

The step of detecting occurrence of a short circuit condition is accomplished by sensing and comparing the respective states of signals at the input and output, and detecting occurrence of an out of state condition between the input and output. If the out of state condition is sensed for a sensing time delay period longer than characteristic propagation delay times tpHL, tpLH for high to low HL and low to high LH transitions at the output, a short circuit sensing signal is generated. The step of tristating the output buffer circuit is accomplished by logically processing the short circuit sensing signal, generating a short circuit tristate enable signal SOEB, and coupling the short circuit tristate enable signal to the tristate enable input of the existing tristate enable circuit for tristating the output buffer circuit. In the case of a non-tristate output buffer, tristate circuitry is added for the purpose of short circuit protection.

The invention is applicable to both non-inverting and inverting, tristate and non-tristate output buffer circuits. For a non-inverting output buffer circuit, an "out of state condition" refers to occurrence of out of phase signals at the input and output for the sensing time delay. For inverting output buffer circuits, an "out of state condition" refers to the occurrence of in phase signals at the input and output for the sensing time delay. As used in the specification and claims, the phrase "out of state condition" is therefore applicable to both non-inverting and inverting output buffer circuits.

According to the invention the step of detecting occurrence of an out of state condition for the sensing time delay period and measuring the sensing time delay period is achieved by charging an integrating capacitor in a sensing signal circuit to a sensing threshold voltage level during occurrence of the out of state condition. This step has the advantage of generating at the integrating capacitor a short circuit sensing signal at the sensing threshold voltage level.

The method also provides further steps of resetting the sensing signal circuit after detecting occurrence of a short circuit condition at the output, and delaying the resetting for a reset time delay period substantially greater than the sensing time delay. Resetting the sensing signal circuit is accomplished by discharging the integrating capacitor in the respective sensing signal circuit. The step of delaying the resetting and for measuring the reset time delay period is accomplished by discharging a reset delay capacitor.

The short circuit tristate enable signal SOEB is generated by a logical processing of the short circuit sensing signal when the short circuit sensing signal reaches the sensing threshold voltage level. Resetting of the sensing signal circuit is accomplished by feeding back the short circuit tristate enable signal, generating a reset signal after the reset time delay, and actuating discharge of the integrating capacitor in the respective sensing signal circuit.

The invention also provides complete circuitry for carrying out the method including a short circuit detecting circuit for detecting occurrence of a short circuit condition of the output and generating a short circuit sensing signal; a sensing signal logic circuit for generating a short circuit tristate enable signal in response to a short circuit sensing signal; and a logical OR coupling of both regular tristate enable signals OEB and short circuit tristate enable signals SOEB to the tristate enable circuit input of the tristate output buffer circuit.

The short circuit detecting circuit is an out of state condition sensing circuit coupled to the input and output for sensing an out of state condition between signals at the input and output. A first sensor circuit senses a first out of state condition between the input and output when the output is shorted to the low potential power rail. A second sensor circuit senses a second out of state condition between the input and output when the output is shorted to the high potential power rail. First and second sensing signal circuits generate first and second sensing signals in response to respective first and second out of state conditions sensed for the duration of the sensing time delay.

The first and second sensing signal circuits incorporate the first and second integrating capacitors with RC time constants for measuring a sensing time delay greater than the characteristic propagation delay times for respective low to high LH and high to low HL transitions at the output. The first and second sensing signal circuits are coupled to a sensing signal logic circuit which generates the short circuit tristate enable signal SOEB.

The reset circuit is provided by first and second reset pulldown transistors coupled between the first and second sensing signal circuits and the low potential power rail for discharging the integrating capacitors. The reset circuit is coupled in a feedback circuit between the short circuit tristate enable signal SOEB and the first and second reset pulldown transistors. The reset circuit feedback circuit incorporates inverter stages and a reset delay capacitor providing an RC time constant for introducing a reset delay time period substantially longer than the sensing time delay period. By way of example, the characteristic propagation delay times for the tristate output buffer circuit may be approximately for example 5 nS, the sensing time delay period may be 50 nS, and the reset time delay period may be 1.5 $\mu S$.

After the sensing signal circuits have been reset by the reset pulldown transistors, the short circuit sensing cycle by the sensor circuits is repeated. If a shorted condition at the output persists after the reset delay time period, it is again detected, causing a return of a short circuit sensing signal to a high potential level, and return of the short circuit tristate enable signal SOEB to a high potential level, tristating the output buffer circuit.

Other objects, features and advantages of the invention are set forth in the following specification and accompanying drawings.

DESCRIPTION OF PREFERRED EXAMPLE EMBODIMENTS AND BEST MODE OF THE INVENTION

Figure 1:
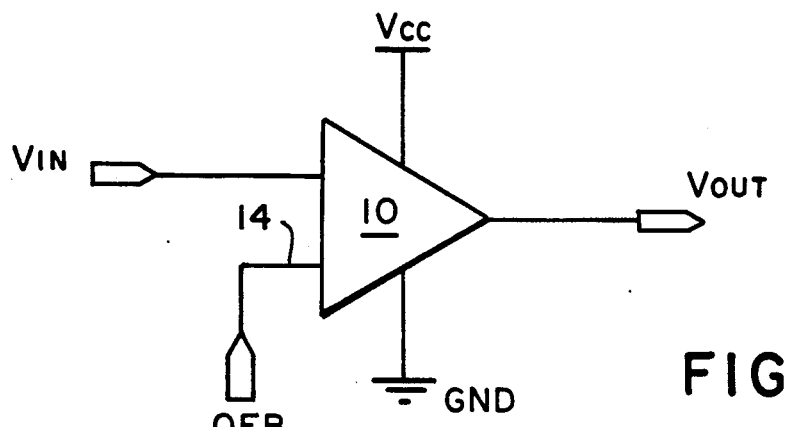
FIGS. 1 and 2 are schematic block diagrams of prior art non-inverting and inverting tristate output buffer circuits.
Figure 2:
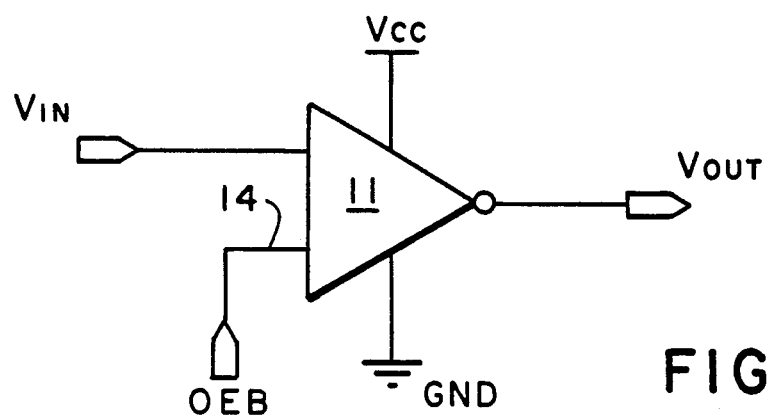
Figure 3:
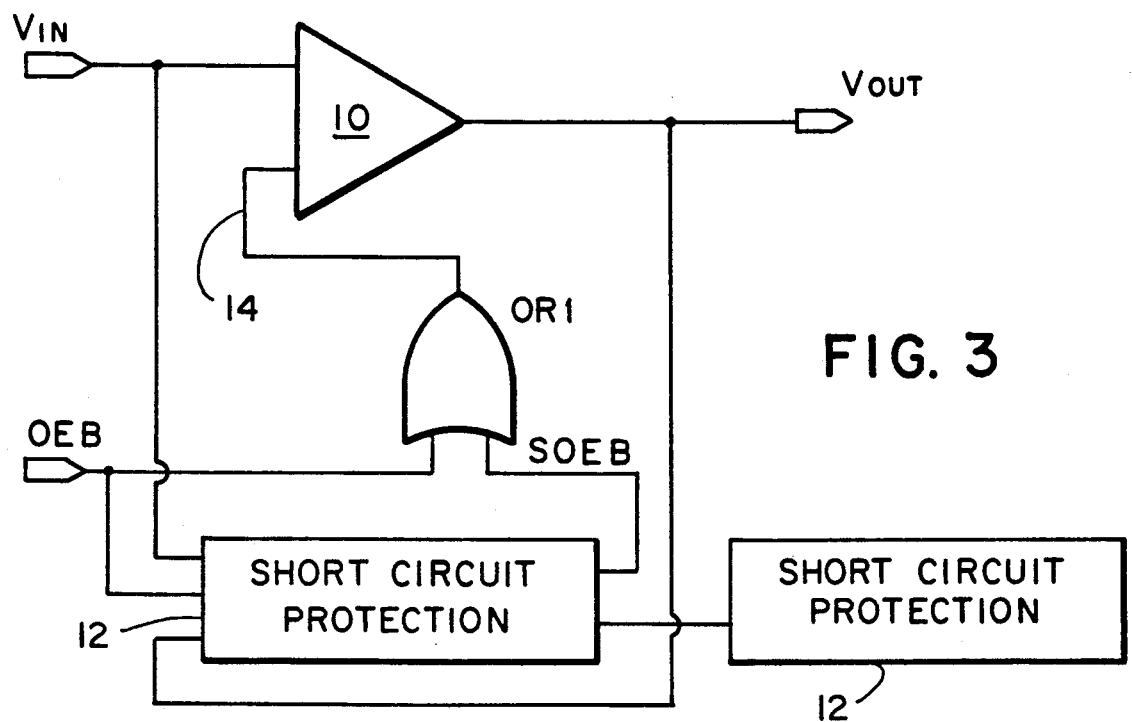
FIG. 3 is a simplified schematic block diagram of a non-inverting tristate output buffer with an improved short circuit protection circuit according to the invention.

By way of example, the present invention is applied to the non-inverting output buffer circuit 10 as illustrated in FIG. 3. The short circuit protection circuit 12 is coupled to both the input $V_{IN}$ and output $V_{OUT}$ of output buffer circuit 10 for sensing an out of state condition which may persist for a sensing time delay period greater than the characteristic propagation delay times tpLH and tpHL of circuit 10. Upon detection of such an out of state condition, the short circuit protection circuit 12 generates a high potential level short circuit tristate enable signal SOEB which is applied at an input of logic OR gate OR1. The other input of gate OR1 is the standard tristate enable signal OEB. The output of gate OR1 is coupled to the tristate enable circuitry of output buffer circuit 10 for tristating output buffer circuit after detection of a short circuit condition. It is noted that the standard tristate enable signal input OEB is also coupled to the short circuit protection circuit 12 for disabling circuit 12 during the standard tristate mode.

In the case of a non-tristate output buffer circuit, tristate enable circuitry of the type set forth in the U.S. Patent references cited above is added to the output buffer circuit for the purpose of short circuit protection. The standard tristate enable input OEB can be omitted as well as OR gate OR1. The short circuit tristate enable input SOEB is then coupled directly to the tristate enable circuit input (14) of the output buffer tristate enable circuitry.

Figure 4:
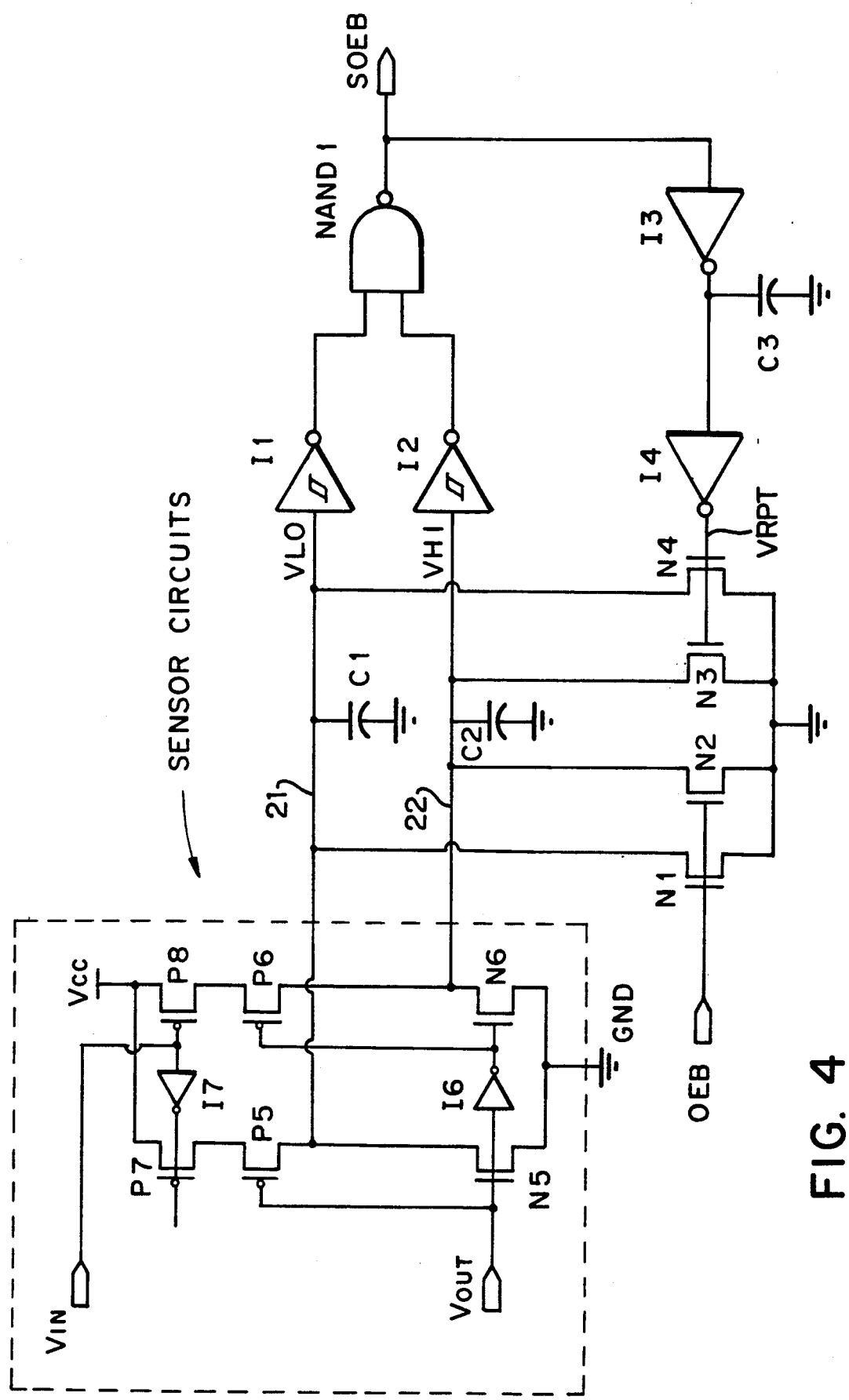
FIG. 4 is a detailed schematic circuit diagram of the short circuit protection circuit.

A detailed implementation of the short circuit protection circuit 12 is illustrated in FIG. 4. The sensor circuits for sensing out of state conditions between the input $V_{IN}$ and output $V_{OUT}$ are indicated by the section of the circuit 12 in dashed outline. A first sensor circuit including CMOS transistor elements N5, P5, P7 and inverter stage 17 senses a first out of state condition when the output $V_{OUT}$ is shorted the low potential power rail GND. For an out of state condition with $V_{IN}$ high and $V_{OUT}$ low for a sensing time delay period tC1, a high potential level first short circuit sensing signal VLO appears on the first sensing signal circuit 21. A high potential level VLO signal indicates an output shorted low condition at the output $V_{OUT}$ of output buffer circuit 10.

The sensing time delay period is provided by a first integrating capacitor C1. Integrating capacitor C1 is coupled between the first sensing signal circuit 21 and the low potential power rail GND. The capacitor C1 integrates the charging current on the first sensing signal circuit 21 and delays the ramping of the output shorted low sensing signal VLO to a high potential level. The capacitance value of integrating capacitor C1 is selected in cooperation with the circuit resistance of adjacent components to provide a sensing time delay period greater than the low to high LH transition propagation delay time tpLH. For example, the charging delay time constant associated with capacitor C1 may be selected to provide a sensing time delay period of 50 nS while the characteristic LH transition propagation delay time tpLH may be only 5 nS.

The first sensor circuit incorporates a sensor inverter stage P5, N5 having control gate nodes coupled to the output $V_{OUT}$ of the output buffer circuit 10. The output node of the first sensor inverter stage P5, N5 is coupled to the first sensing signal circuit 21. A first sensor switch transistor P7 is coupled between the first sensor inverter stage P5, N5 and the high potential power rail $V_{CC}$. The control gate node of switch transistor P7 is coupled to the input $V_{IN}$ through an input inverter stage 17. By this circuit coupling, for an out of state condition with $V_{OUT}$ shorted to a low potential level, sourcing current is applied on the first sensing signal circuit 21 for ramping the output shorted low sensing signal VLO to a high potential level subject to the sensing time delay period interposed by integrating capacitor C1.

A second sensor circuit 16, P6, N6, P8 senses a second out of state condition between the input $V_{IN}$ and output $V_{OUT}$ when the output is shorted to the high potential power rail $V_{CC}$. If the out of state condition is sensed for a time delay period tC2 greater than the characteristic propagation delay time tpHL for a high to low HL transition at the output, a high potential level second short circuit sensing signal VHI appears on the second sensing signal circuit 22.

The sensing time delay period tC2 on the second sensing signal circuit 22 is determined by integrating capacitor C2 coupled between the circuit 22 and low potential power rail GND. Integrating capacitor C2 integrates charging current on the second sensing signal circuit 22 and delays ramping of the output shorted high sensing signal VHI. The capacitance of integrating capacitor C2 is also selected in cooperation with the resistance of adjacent components to yield a charging delay time constant providing the sensing delay time period tC2 greater than the high to low HL transition propagation delay time tpHL. For example the charging time constant of capacitor C2 is selected to provide a sensing time delay period of 50 nS while the characteristic propagation delay time tpHL is only 5 nS.

The second sensor circuit incorporates a second sensor inverter stage P6, N6 having control gate nodes coupled to the output $V_{OUT}$ through an output inverter stage 16. The output node of second sensor inverter stage P6, N6 is coupled to the second sensing signal circuit 22. A second sensor switch transistor P8 is coupled between the second inverter stage P6, N6 and the high potential power rail $V_{CC}$. The control gate node of second sensor switch transistor P8 is coupled to the input $V_{IN}$. By this circuit arrangement, for an out of state condition with the output $V_{OUT}$ shorted to a high potential level, sourcing current is applied to the second sensing signal circuit 22 for ramping the output shorted high sensing signal VHI to a high potential level subject to the sensing time delay period tC2 interposed by integrating capacitor C2.

A high potential level output shorted sensing signal VLO, VHI on either of the sensing signal circuits 21, 22 is converted to a short circuit tristate enable signal SOEB by sensing signal logic circuit I1, I2, NAND1. A first logic circuit inverter stage I1 is coupled to the first sensing signal circuit 21 for receiving the output shorted low sensing signal VLO. A second logic circuit inverter stage I2 is coupled to the second sensing signal circuit 22 for receiving the output shorted high sensing signal VHI. The outputs of first and second stages I1 and I2 provide the inputs to NAND gate NAND1 having a logic output which provides the short circuit tristate enable signal SOEB. The sensing signal logic circuit provides an SOEB high potential level for tristating the output buffer circuit 10 in response to either a high potential level output shorted low sensing signal VLO or a high potential level output shorted high sensing signal VHI which equal or exceed the input threshold of respective inverter stages I1, I2. Inverter stages I1 and I2 are Schmidt trigger circuits to provide a greater noise margin and noise immunity.

The sensing signal reset circuit for the short circuit protection circuit 12 is provided by a feedback circuit coupled between the SOEB output and the first and second sensing signal circuits 21, 22. The reset circuit resets the signal circuits 21, 22 and the short circuit sensing signals VLO, VHI in response to a high potential level short circuit tristate enable signal SOEB. The reset circuit incorporates a reset delay capacitor C3 for delaying reset of the sensing signal circuits 21, 22.

The reset delay capacitor C3 is coupled on one side to a node between inverter stages I3 and I4 in the reset feedback circuit. The other side of reset delay capacitor C3 is coupled to the ground potential power rail GND. The output of the second inverter stage I4 is coupled to control the first and second sensing signal pulldown transistors N4, N3 which are in turn coupled between the respective sensing signal circuits 21, 22 and the low potential power rail GND. The reset delay capacitor C3 is selected with a decay time constant in cooperation with the resistance of adjacent circuit components to afford a sensing signal reset delay time period tC3 substantially longer than either of the sensing time delay periods tC1, tC2. For example the capacitance of reset delay capacitor C3 and the values of adjacent circuit components are selected to provide a reset time delay period, of for example, 1.5 μS in comparison with the sensing time delay period of 50 nS.

In response to an SOEB high signal, inverter stage I3 pulls down the intermediate reset signal VRPT subject to the reset time delay interposed by the discharge time constant of delay capacitor C3. After pulldown of the reset signal VRPT, inverter stage I4 applies high potential level signals to the sensing signal circuit pulldown transistor elements N4, N3. After the reset feedback circuit time delay interval of 1.5 μS, integrating capacitors C1, C2 are discharged in preparation for resensing the occurrence or continuing presence of respective out of state conditions either output shorted high or output shorted low as heretofore described. The continuing occurrence of either out of state condition restores the high potential level of either short circuit sensing signals VLO, VHI and the high potential level short circuit tristate enable signal SOEB for tristating the output buffer circuit 10.

It is noted in the circuit of FIG. 4 that additional tristate pulldown transistors N1, N2 are provided in parallel with reset pulldown transistors N4, N3. The control gate nodes of tristate pulldown transistors N1, N2 are coupled to the standard tristate enable signal input OEB for disabling the short circuit protection circuit 12 when the output buffer circuit 10 is also disabled in the tristate mode.

Figure 5:
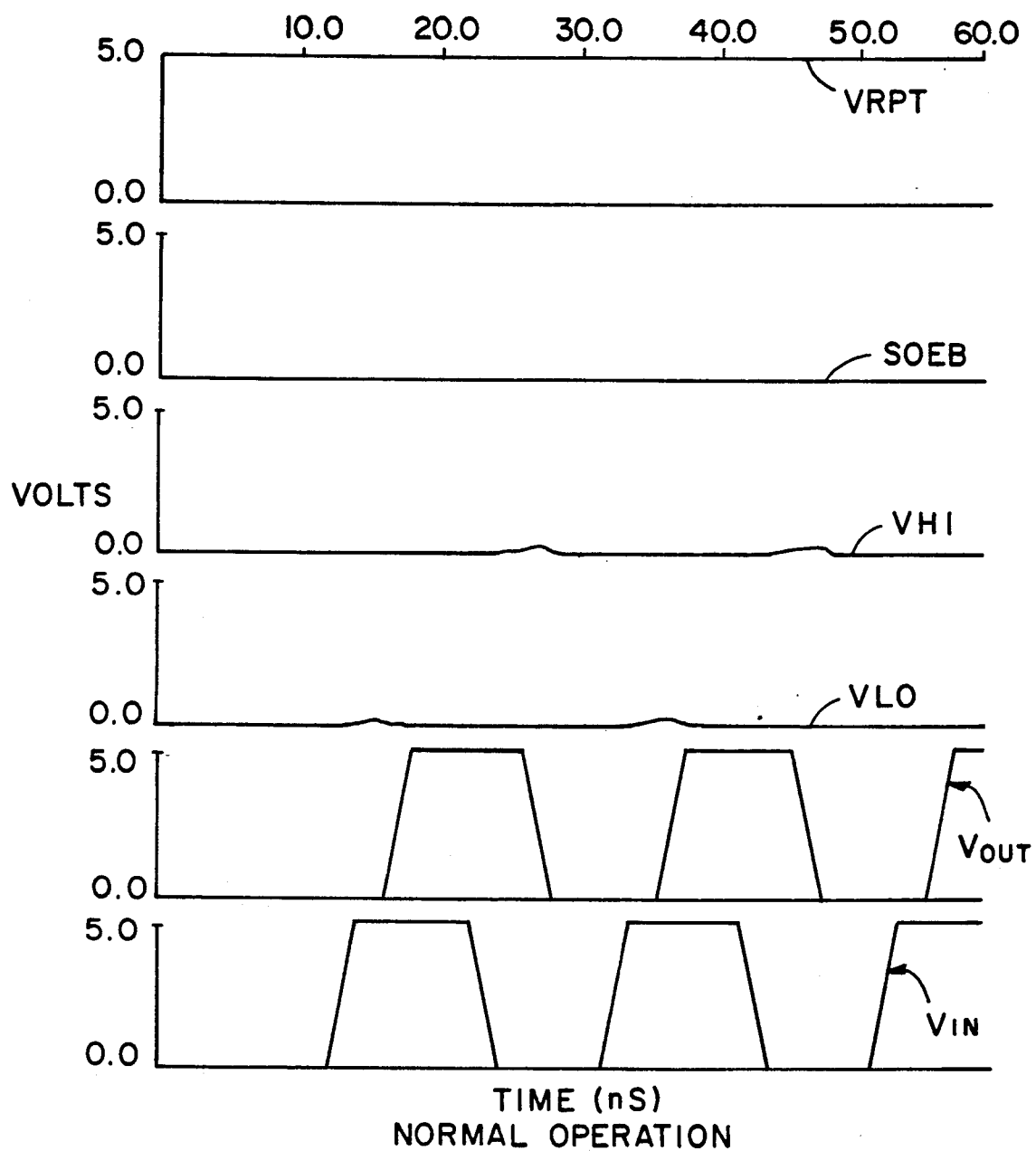
FIG. 5 is a timing diagram or graph of voltage signals at selected components of the circuit of FIGS. 3 and 4 during normal operation of the tristate output buffer circuit.
Figure 6:
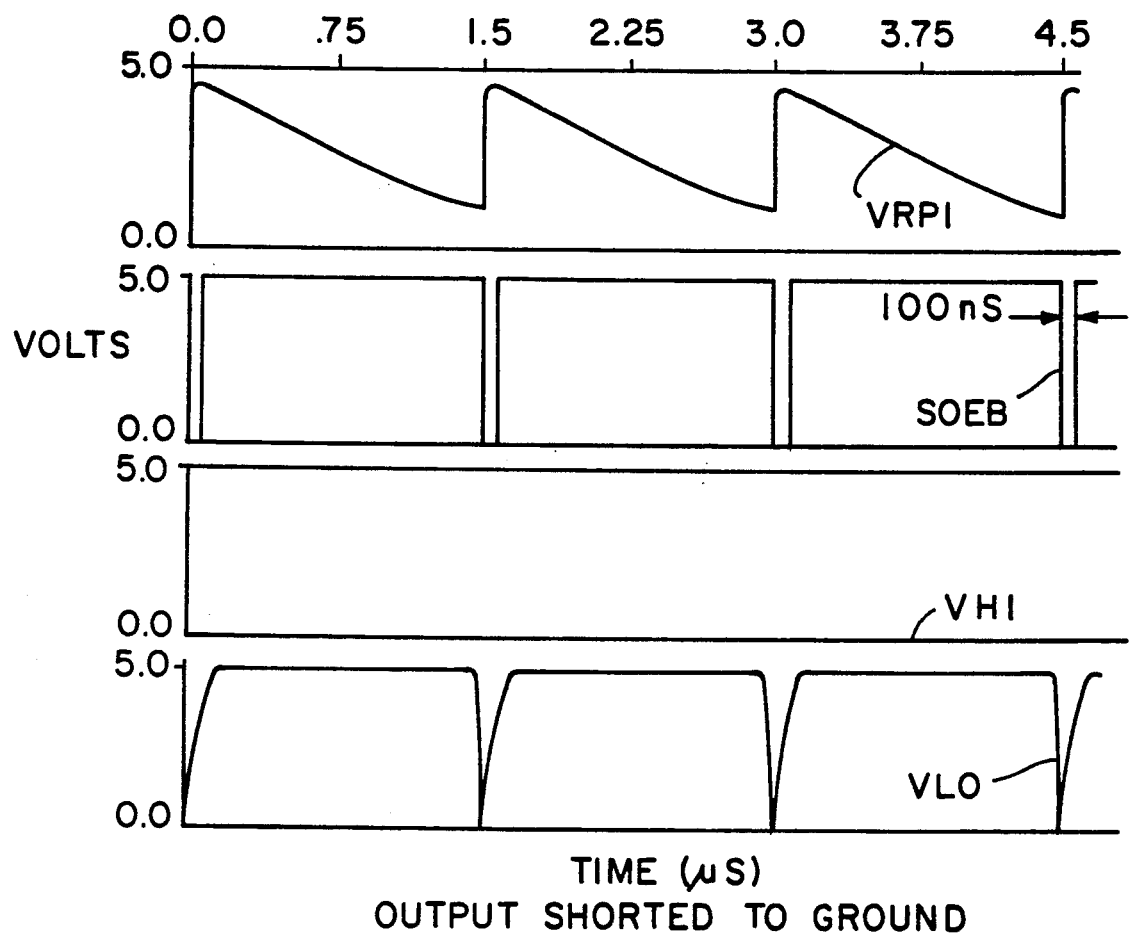
FIG. 6 is a timing diagram or graph of voltage signals at selected components of the short circuit protection circuit during operation of the tristate output buffer circuit with a shorted condition of the output shorted to the low potential power rail GND.

Operation of the output buffer circuit 10 with the short circuit protection circuit 12 of FIG. 4 is illustrated in the graphs of FIGS. 5,6,7 and 8. FIG. 5 is a timing diagram showing the respectively identified voltage signals during normal operation of the output buffer circuit 10 in the bistate mode of operation. The voltage signals at the input $V_{IN}$ and the output $V_{OUT}$ are substantially in phase or in the same state subject to the standard 5 nS propagation delays. The voltage signals VLO, VHI, and SOEB, identified in FIG. 4 are all at low potential level while the reset voltage signal VRPT is at a high potential level. With the output $V_{OUT}$ shorted to the low potential power rail GND, the output shorted low sensing signal VLO goes high causing a high potential level short circuit enable signal SOEB as shown in FIG. 6. The reset signal VRPT causes resetting of the output shorted low sensing signal VLO. The sensor circuit again senses the output shorted low condition and VLO returns to the high potential level along with SOEB.

Figure 7:
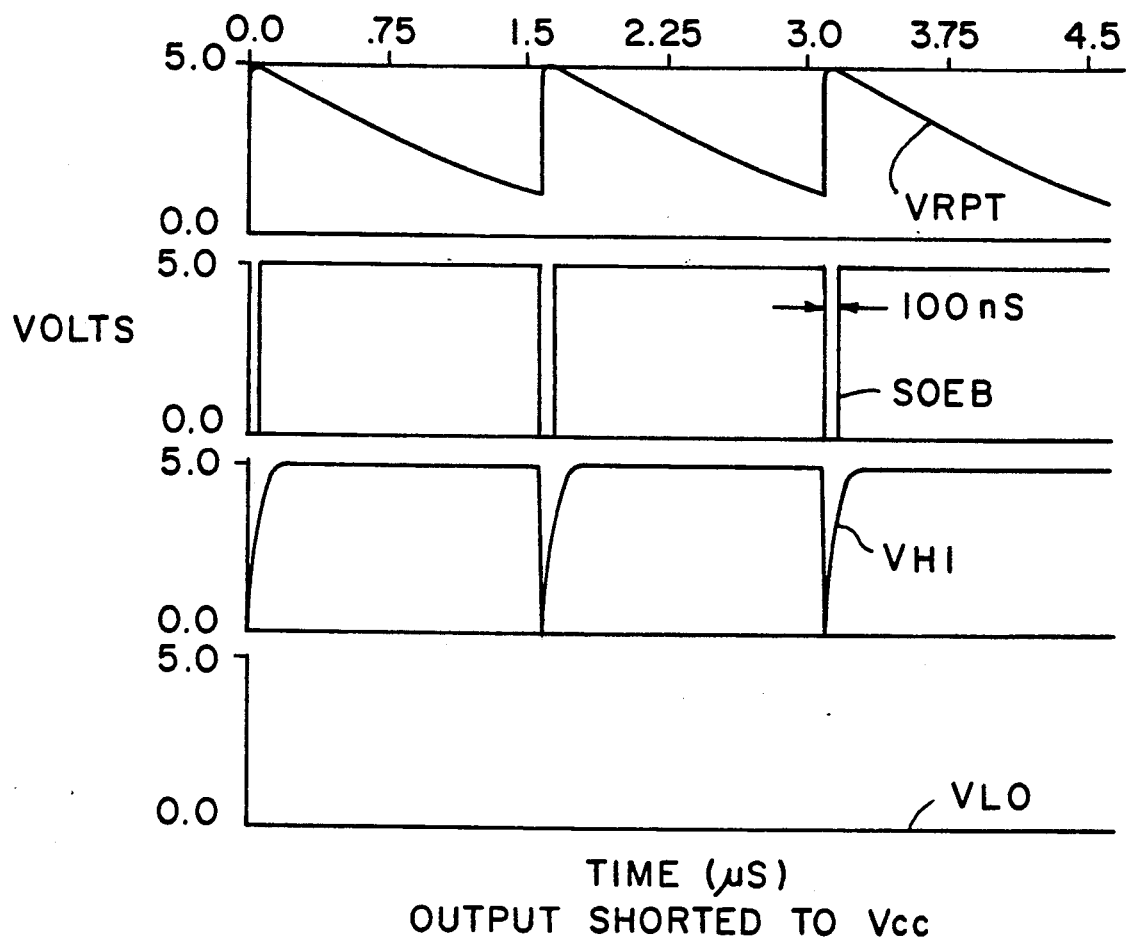
FIG. 7 is a timing diagram or graph of the voltage signals at selected components of the short circuit protection circuit during operation of the tristate output buffer circuit with a shorted condition of the output shorted to the high potential power rail $V_{CC}$.
Figure 8:
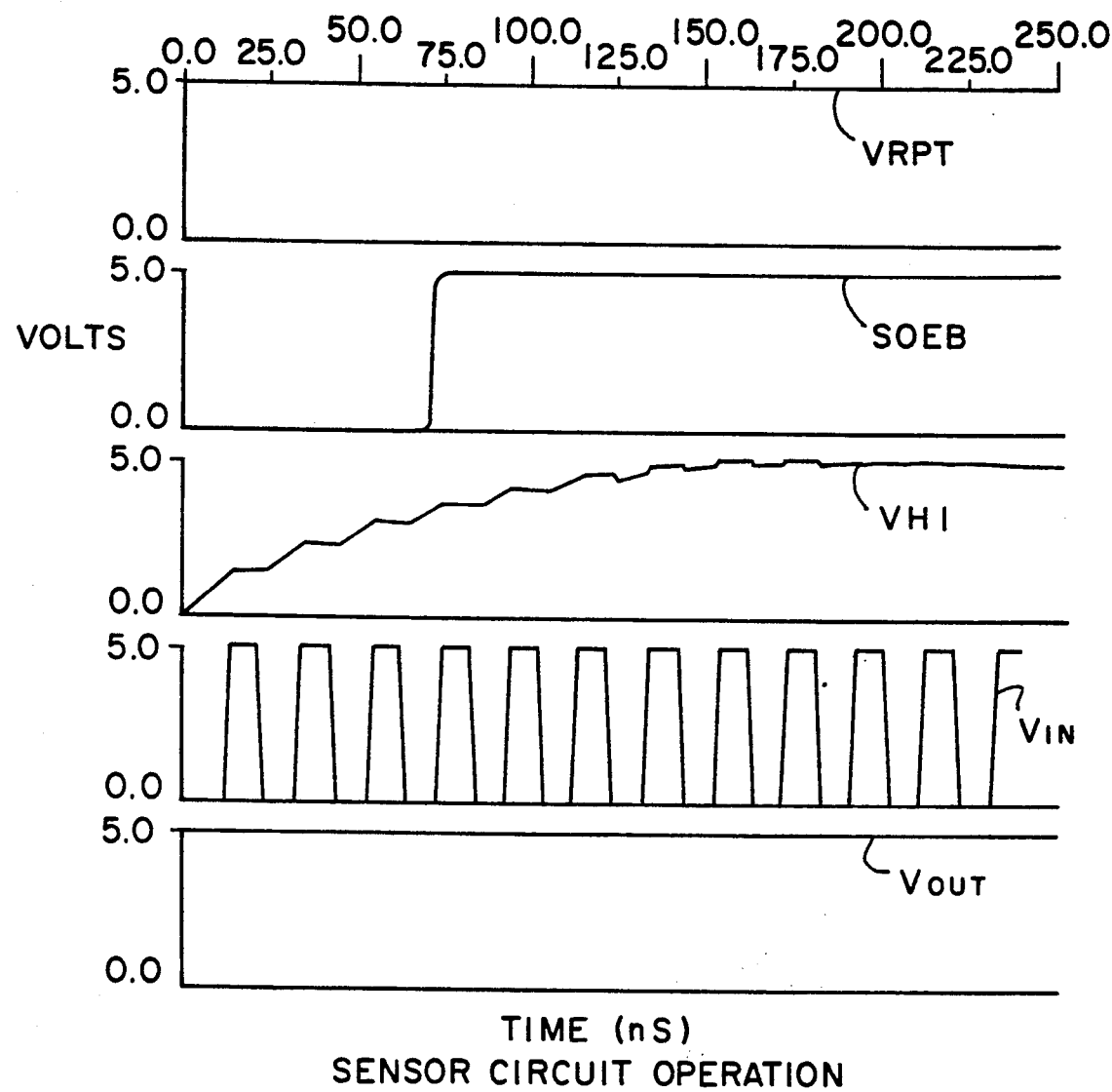
FIG. 8 is a timing diagram or graph of selected voltage signals showing operation of the tristate output buffer circuit over an extended period of time with a prolonged short circuit condition of the output shorted to the low potential power rail.

For the condition in which the output $V_{OUT}$ is shorted to the high potential power rail $V_{CC}$, a similar characterization applies to the output shorted high sensing signal VHI as shown in FIG. 7. The cumulative operation of the output buffer circuit with short circuit protection over an amplified period of time with a prolonged short circuit condition of the output shorted to the high potential power rail $V_{CC}$ is illustrated in the timing diagram of FIG. 8. Output shorted high sensing signal VHI increases in increments during integration by integrating capacitor C2 until the threshold of I2 is reached, SOEB then goes high.

For application of the short circuit protection circuit 12 to an inverting tristate output buffer circuit 11, the circuit of FIG. 4 is modified as follows. The input inverter stage I7 of the first sensor circuit P5, N5, P7, I7 is reversed to apply the input signal at $V_{IN}$ after inversion to the control gate node of P8 in the second sensor circuit. The input signal at the input $V_{IN}$ is applied without inversion at the control gate node of P7.

While the invention has been described with reference to particular example embodiments it is intended to cover all modifications and equivalents within the scope of the following claims.

I claim:

1. A method of protecting an output buffer circuit (10,11) from short circuit conditions of the output ($V_{OUT}$) shorted to either a high potential power rail ($V_C$) or a low potential power rail (GND), said output buffer circuit normally delivering output signals with high (H) and low (L) potential states at the output ($V_{OUT}$) in response to respective input signals at an input ($V_{IN}$), and having a tristate enable circuit with tristate enable circuit input (14) for tristating the output buffer circuit with a high impedance third state (Z) and the output ($V_{OUT}$) comprising:

detecting occurrence of a short circuit condition of the output ($V_{OUT}$) shorted to either the high potential power rail ($V_{CC}$) or low potential power rail (GND) by sensing and comparing the respective states of signals at the input ($V_{IN}$) and output ($V_{OUT}$) in a sensing signal circuit (21,22);

detecting occurrence of an out of state condition between the input ($V_{IN}$) and output ($V_{OUT}$) for a specified sensing time delay period (tC1, tC2) longer than characteristic propagation delay times (tpHL, tpLH) for high to low (HL) and low to high (LH) transitions at the output ($V_{OUT}$) and measuring the sensing time delay period by charging a charge integrator (C1, C2) in the sensing signal circuit (21,22);

generating a short circuit sensing signal (VLO, VHI) in the sensing signal circuit (32, 33) in response to detection of an out of state condition for said specified sensing time delay period;

and tristating the output buffer circuit (10,11) in response to the short circuit sensing signal (VLO, VHI).

2. The method of claim 1 wherein the step of tristating the output buffer circuit (10,11) comprises:

logically processing the short circuit sensing signal (VLO, VHI) and generating a short circuit tristate enable signal (SOEB);

and coupling the short circuit tristate enable signal (SOEB) to a tristate enable circuit input (14) of the tristate enable circuit for tristating the output buffer circuit.

3. The method of sensing signal circuit (21,22) after detecting occurrence of a short circuit condition at the output ($V_{OUT}$);

and delaying the resetting for a reset time delay period (tC3) substantially greater than the sensing time delay period (tC1, tC2).

4. The method of claim 2 wherein the step of detecting occurrence of an out of state condition for the sensing time delay period (tC1, tC2) comprises measuring the sensing time delay period by charging an integrating capacitor (C1, C2) in the sensing signal circuit (21, 22)

to a sensing threshold voltage level during occurrence of the out of state condition, thereby also generating at said integrating capacitor (C1, C2) a short circuit sensing signal (VLO, VHI) at said sensing threshold voltage level.

5. The method of claim 4 comprising further steps of:
resetting the sensing signal circuit (21, 22) after detecting occurrence of a short circuit condition at the output ($V_{OUT}$);
and delaying the resetting for a rest time delay period (tC3) substantially greater than the sensing time delay period (tC1, tC2).

6. The method of claim 5 wherein the step of resetting the sensing signal circuit (21, 22) comprises discharging the integrating capacitor (C1, C2) in the sensing signal circuit (21, 22).

7. The method of claim 6 wherein the step of delaying the resetting for a reset time delay period (tC3) comprises measuring the reset time delay period by discharging a reset delay capacitor (C3).

8. The method of claim 7 wherein the step of resetting the sensing signal circuit (21,22) comprises feeding back the short circuit tristate enable signal (SOEB), generating a reset signal (VRPT) from said short circuit tristate enable signal (SOEB) after said reset time delay period (tC3), and actuating discharge of the integrating capacitor (C1, C2) in the sensing signal (21, 22).

9. A short circuit protection circuit (12) for protecting an output buffer circuit (10,11) from a short circuit condition at the output ($V_{out}$) comprising:
a short circuit detecting circuit for detecting occurrence of a short circuit condition of the output ($V_{OUT}$) shorted to either a high potential power rail ($V_{CC}$) or a low potential power rail (GND);
a delay circuit (21,22) coupled to the short circuit detecting circuit for sensing the direction of a short circuit condition and generating a short circuit sensing signal (VLO, VLO) after sensing a short circuit condition for a specified sensing time delay period (tC1, tC2);
and a short circuit tristating enable circuit for tristating the output buffer circuit (10,11) in response to the short circuit sensing signal.

10. An output buffer circuit (10,11) having an output ($V_{OUT}$) for delivering output signals with high (H) and low (L) potential states in response to respective input signals at an input ($V_{IN}$) with characteristic propagation delay times (tpHL, tpLH) for respective transitions from high to low (HL) and low to high (LH) potential states at the output ($V_{OUT}$), said output buffer circuit having a tristate enable circuit and tristate enable circuit input (14) for tristating the output buffer circuit (10,11) with a high impedance third state (Z) at the output ($V_{OUT}$), said output buffer circuit being coupled between high and low potential power rails ($V_{CC}$, GND) for sourcing and sinking current at the output ($V_{OUT}$), said output buffer circuit having an improved short circuit protection circuit (12) comprising:
a short circuit detecting circuit for detecting occurrence of a short circuit condition of the output ($V_{OUT}$) shorted to either the high potential power rail ($V_{CC}$) or the low potential power rail (GND) and for generating a short circuit sensing signal (VLO, VHI);
said short circuit detecting circuit comprising an out of state condition sensing circuit coupled to the input ($V_{IN}$) and output ($V_{OUT}$) for sensing an out of state condition between signals at the input ($V_{IN}$) and output ($V_{OUT}$) and a delay circuit for sensing the direction of the out of state condition for a sensing time delay period (tC1, tC2) greater than the characteristic propagation delay times (tpHL, tpLH) of the output buffer circuit (10,11), and for generating a short circuit sensing signal (VLO, VHI);
said out of state condition sensing circuit comprising an output shorted low (L) first sensor circuit (N5,P5,P7,I7) for sensing a first out of state condition between the input ($V_{IN}$) and output ($V_{OUT}$) when the output is shorted to the low potential power rail (GND) for a sensing time delay period (tC1) longer than the characteristic propagation delay time (tpLH) for a low to high (LH) transition at the output ($V_{OUT}$);
a first sensing signal circuit (21) coupled to the first sensor signal for generating a short circuit first sensing signal (VLO);
a first sensing signal logic circuit coupled to the short circuit detecting circuit for generating a short circuit tristate enable signal (SOEB) at a logic circuit SOEB circuit in response to a short circuit first sensing signal (VLO);
said short circuit tristate enable signal (SOEB) being coupled to the tristate enable circuit input (14) for tristating the output buffer circuit.

11. The output buffer circuit of claim 10 wherein the first sensing signal circuit (21) comprises a first integrating capacitor (C1) coupled between the first sensing signal circuit (21) and low potential power rail (GND) for integrating the short circuit first sensing signal (VLO), said first integrating capacitor (C1) having a charging delay time constant selected to provide a sensing time delay period (tC1) greater than the low to high (LH) transition propagation delay time (tpLH), for integrating the first sensing signal (VLO) to a threshold voltage level over the sensing time delay period (tC1) in response to said first out of state condition between the input ($V_{IN}$) and output ($V_{OUT}$).

12. The output buffer of claim 11 wherein the out of state condition sensing circuit comprises an output shorted high (H) second sensor circuit (I6,N6,P6,P8) for sensing a second out of state condition between the input ($V_{IN}$) and output ($V_{OUT}$) when the output is shorted to the high potential power rail ($V_{CC}$) for a sensing time delay period (tC2) longer than the characteristic propagation delay time (tpHL) for high to low (HL) transition at the output ($V_{OUT}$);
and a second sensing signal circuit (22) coupled to the second sensor circuit for generating a short circuit second sensing signal.

13. The output buffer circuit of claim 12 wherein the second sensing signal circuit (22) comprises a second integrating capacitor (C2) coupled between the second sensing signal circuit (22) and low potential power rail (GND) for integrating the second short sensing signal (VHI), said second integrating capacitor (C2) having a charging delay time constant causing a sensing time delay period (tC2) greater than the high to low (HL) transition propagation delay time (tpHL), for integrating the second sensing signal ($V_{HI}$) to a threshold voltage level over the sensing time delay period (tC2) in response to said second out of state condition between the input ($V_{IN}$) and output ($V_{OUT}$).

14. The output buffer circuit of claim 13 wherein the first sensor circuit (N5,P5,P7,I7) comprises:

a first sensor inverter stage (N5,P5) having control gate nodes coupled to the output ($V_{OUT}$) and a first sensor inverter stage output node coupled to the first sensing signal circuit (21);

and a first sensor switch transistor (P7) coupled to the first sensor inverter stage (P5,N5) and the high potential power rail ($V_{CC}$), said first sensor switch transistor (P7) having a control gate node coupled to the input ($V_{IN}$) through an input inverter stage (I7).

15. The output buffer circuit of claim 14 wherein the second sensor circuit (I6,N6,P6,P8) comprises:

a second sensor inverter stage (P6,N6) having control gate nodes coupled to the output ($V_{OUT}$) through an output inverter stage (I6) and having a second sensor inverter stage output node coupled to the second sensing signal circuit (22);

and a second sensor switch transistor (P8) coupled between the second inverter stage (P6,N6) and the high potential power rail ($V_{CC}$) having a control gate node coupled to the input ($V_{IN}$).

16. The output buffer circuit of claim 15 comprising a sensing signal reset circuit coupled in a feedback circuit between the logic circuit SOEB output and the first and second sensing signal circuits (21,22) for resetting said sensing signal circuits (21,22) in response to a short circuit tristate enable signal (SOEB), said sensing signal reset circuit comprising a reset delay element (C3) delaying reset of the sensing signal circuits (21,22) for a reset time delay period (tC3) substantially greater than the sensing time delay period (tC1, tC2).

17. The output buffer circuit of claim 16 wherein the sensing signal reset circuit comprises a first sensor pulldown transistor (N4) coupled between the first sensor circuit (21) and the low potential power rail (GND) and a second sensor pulldown transistor (N3) coupled between the second sensor circuit (22) and the low potential power rail (GND).

18. The output buffer circuit of claim 17 wherein the delay element comprises a reset delay capacitor (C3) coupled between the sensing signal reset circuit and the low potential power rail (GND), said reset delay capacitor (C3) being selected to have a decay time constant in cooperation with the sensing signal reset circuit causing a reset time delay period (tC3) substantially longer than the sensing time delay period (tC1, tC2).

19. The output buffer circuit of claim 18 wherein the sensing signal reset circuit comprises first and second reset inverter stages (I3, I4) coupled in series, said reset delay capacitor (C3) being coupled to a node between the first and second reset inverter stages and to the low potential power rail (GND).

20. The output buffer circuit of claim 19 wherein the tristate enable circuit input (14) is also coupled to the output short circuit protection circuit (12) for tristating the short circuit protection circuit (12) in response to a tristate enable signal (OEB).

21. The output buffer circuit of claim 10 wherein a tristate enable signals (OEB) and the short circuit tristate enable signals (SOEB) are coupled to the tristate enable circuit input (14) and tristate enable circuit through an OR gate (OR1).

22. The output buffer circuit of claim 12 wherein the sensing signal logic circuit comprises a first logic circuit inverter stage (I1) coupled to the first sensing signal circuit (21) for receiving a short circuit first sensing signal (VLO), a second logic circuit inverter stage (I2) coupled to the second sensing signal circuit (22) for receiving a short circuit second sensing signal (VHI), and a NAND gate (NAND1) having logic inputs coupled to the first and second logic circuit inverter stages (I1,I2), said NAND gate (NAND1) having a logic output providing the logic circuit SOEB output.

23. A method of protecting an output buffer circuit (10,11) from a short circuit condition at the output ($V_{OUT}$) comprising:

detecting occurrence of a short circuit condition of the output ($V_{OUT}$) shorted to either a high potential rail ($V_{CC}$) or a low potential rail (GND);

sensing the duration of the short circuit condition using a delay circuit (C1,C2) and generating a short circuit sensing signal (VLO,VHI) after sensing a short circuit condition for a specified sensing time delay interval (tC1,tC2);

and tristating the output buffer circuit (10,11) in response to the short circuit sensing signal.

24. The method of claim 23 wherein the step of sensing the duration of the short circuit condition using a delay circuit comprises charging a charge integrator (C1,C2) during occurrence of a short circuit condition to a threshold voltage level (VTHI1,VTHI2) after the specified sensing time delay period.

25. The short circuit protection circuit of claim 9 wherein the delay circuit (21,22) comprises a charge integrator (C1,C2) coupled to integrate charge during occurrence of a short circuit condition to a threshold voltage level after a specified sensing time delay period (tC1,tC2).

* * * * *